(12) United States Patent
Larriere et al.

(10) Patent No.: US 11,577,544 B2
(45) Date of Patent: Feb. 14, 2023

(54) EXTERNAL ELEMENT OR TIMEPIECE DIAL MADE OF NON-CONDUCTIVE MATERIAL

(71) Applicant: Rubattel & Weyermann S.A., La Chaux-de-Fonds (CH)

(72) Inventors: Mehdy Larriere, Villers-le-Lac (FR); Benjamin Tixier, Neuchatel (CH)

(73) Assignee: Rubattel & Weyermann S.A., La Chaux-de-Fonds (CH)

( * ) Notice: Subject to any disclaimer, the term of this patent is extended or adjusted under 35 U.S.C. 154(b) by 931 days.

(21) Appl. No.: 16/464,850

(22) PCT Filed: Dec. 14, 2017

(86) PCT No.: PCT/EP2017/082767
§ 371 (c)(1),
(2) Date: May 29, 2019

(87) PCT Pub. No.: WO2018/109065
PCT Pub. Date: Jun. 21, 2018

(65) Prior Publication Data
US 2019/0302697 A1    Oct. 3, 2019

(30) Foreign Application Priority Data
Dec. 16, 2016    (EP) .................................... 16204645

(51) Int. Cl.
*B44C 1/22*     (2006.01)
*G04B 19/12*    (2006.01)
(Continued)

(52) U.S. Cl.
CPC .............. *B44C 1/228* (2013.01); *C03C 15/00* (2013.01); *C03C 17/34* (2013.01); *C03C 17/36* (2013.01);
(Continued)

(58) Field of Classification Search
None
See application file for complete search history.

(56) References Cited

U.S. PATENT DOCUMENTS

| | | | |
|---|---|---|---|
| 2013/0208577 A1* | 8/2013 | Netuschill | C25D 5/02 205/95 |
| 2014/0112112 A1* | 4/2014 | Plankert | G04B 19/18 264/603 |

(Continued)

FOREIGN PATENT DOCUMENTS

| | | |
|---|---|---|
| CH | 710 716 A2 | 8/2016 |
| CN | 1263441 A | 8/2000 |

(Continued)

OTHER PUBLICATIONS

International Search Report dated Apr. 3, 2018 in PCT/EP2017/082767 filed on Dec. 14, 2017.

(Continued)

*Primary Examiner* — Roberts P Culbert
(74) *Attorney, Agent, or Firm* — Oblon, McClelland, Maier & Neustadt, L.L.P.

(57) ABSTRACT

A method for fabricating an external element or a timepiece dial from non-conductive material, by performing or repeating a basic cycle of making a base from a non-conductive, or ceramic, or glass. or sapphire substrate; dry coating the base with a first sacrificial protective metal layer; etching a decoration with an ultrashort pulse laser to a depth at least equal to the local thickness of the first layer; dry coating the decoration and the remaining part of the first layer with a second metal and/or coloured decorative treatment layer; chemically removing each first layer; and before or after chemical removal of each first layer, mechanically levelling on the upper level of the base the compound thus formed.

16 Claims, 2 Drawing Sheets

(51) Int. Cl.

| | | |
|---|---|---|
| *G04B 37/22* | (2006.01) | |
| *G04D 3/00* | (2006.01) | |
| *C23C 14/04* | (2006.01) | |
| *G04B 45/00* | (2006.01) | |
| *C23C 14/02* | (2006.01) | |
| *C23C 14/14* | (2006.01) | |
| *C23C 14/58* | (2006.01) | |
| *C23C 28/02* | (2006.01) | |
| *C23C 28/00* | (2006.01) | |
| *C03C 17/34* | (2006.01) | |
| *C23F 1/00* | (2006.01) | |
| *C03C 15/00* | (2006.01) | |
| *C03C 17/36* | (2006.01) | |

(52) U.S. Cl.
CPC .......... *C23C 14/025* (2013.01); *C23C 14/042* (2013.01); *C23C 14/14* (2013.01); *C23C 14/588* (2013.01); *C23C 14/5873* (2013.01); *C23C 28/00* (2013.01); *C23C 28/02* (2013.01); *C23F 1/00* (2013.01); *G04B 19/12* (2013.01); *G04B 37/22* (2013.01); *G04B 37/226* (2013.01); *G04B 45/0076* (2013.01); *G04D 3/0069* (2013.01); *G04D 3/0092* (2013.01); *G04D 3/0097* (2013.01); *C03C 2218/328* (2013.01)

(56) References Cited

U.S. PATENT DOCUMENTS

| | | |
|---|---|---|
| 2015/0092524 A1 | 4/2015 | Verdon |
| 2016/0263698 A1 | 9/2016 | Noirot et al. |

FOREIGN PATENT DOCUMENTS

| | | |
|---|---|---|
| CN | 1349139 A | 5/2002 |
| CN | 1669828 A | 9/2005 |
| CN | 105272379 A | 1/2016 |
| CN | 105374767 A | 9/2016 |
| EP | 2 856 903 B1 | 4/2015 |
| EP | 2 965 855 A2 | 1/2016 |
| EP | 3 067 220 A1 | 9/2016 |
| JP | 5-1 56425 A | 6/1993 |

OTHER PUBLICATIONS

Office Action dated Jun. 16, 2020 in corresponding Japanese Patent Application No. 2019-530012, (with English Translation), 9 pages.
Combined Chinese Office Action and Search Report dated Oct. 9, 2020 in Chinese Patent Application No. 201780077791.X (with English translation of Category of Cited Documents), 7 pages.

\* cited by examiner

EXTERNAL ELEMENT OR TIMEPIECE DIAL MADE OF NON-CONDUCTIVE MATERIAL

CROSS-REFERENCE TO RELATED APPLICATIONS

The present application is a national stage entry of International Application No. PCT/EP2017082767, filed Dec. 14, 2017, which claims priority to European Patent Application No. 16204645.2, filed on Dec. 16, 2016, each of which are incorporated by reference herein.

FIELD OF THE INVENTION

The invention concerns a method for fabricating an external element or timepiece dial from non-conductive material, wherein a basic cycle is performed at least once, including, in this order, the following steps:
  making a base from a substrate made of non-conductive material, or ceramic or glass or sapphire or at least partially amorphous material,
  dry coating said base with at least a first sacrificial protective metal layer;
  etching a decoration, to a depth at least equal to the local thickness of said first sacrificial protective metal layer, by means of an ultrashort pulse laser of the femto laser or pico laser type;
  dry coating said decoration and the remaining part of said first sacrificial protective metal layer with at least a second metal and/or coloured decorative treatment layer;
  chemically removing each said first sacrificial protective metal layer.

The invention also concerns a watch including an external element and/or dial made by this method.

The invention concerns the field of external or display components for horology, and the field of jewelry.

BACKGROUND OF THE INVENTION

To fabricate two-coloured components, there is a known method consisting in:
  placing a sacrificial protective layer (photosensitive resin, varnish, adhesive, polymer film) over the entire surface of a blank;
  selectively etching the protective layer, possibly also etching the substrate;
  performing a decorative treatment (galvanoplasty, vacuum deposition, varnish, lacquer);
  removing the protective layer (chemical etch, dissolution, ion bombardment, mechanical action).

Unless photosensitive resin is used, the definition of contours is not very good.

Moreover, the material of the sacrificial protective layer may exhibit a degassing phenomenon during any subsequent vacuum treatment, especially to perform the decorative treatment by a metallizing process.

JP Patent Application No. H05156425A in the name of SEIKO EPSON Corp. discloses the forming of a hollow letter, or more generally a pattern, coated with a coloured film, on the surface of a basic material, such as a sintered hard alloy, an alloy of platinum or of white gold, of ceramic, by a dry film forming method. The surface of the material is coated with a coloured film as first layer, a hollow pattern having a depth greater than the thickness of the first layer is formed on the part concerned by laser beam machining, the coloured film having a different composition from that of the first layer is applied as second layer by a dry film forming process, then the first and second layers are removed, except from the area including the pattern.

EP Patent Application No. 3067220A1 in the name of ROLEX discloses a method for decorating a timepiece element, with deep etching of a surface of the element to be decorated using a femtosecond laser; and surface structuring of the surface of the timepiece element to be decorated, these two decorations being at least partially superposed on one another.

SUMMARY OF THE INVENTION

The invention proposes to develop a method for fabricating an external element or timepiece dial made of non-conductive material, especially made of ceramic or similar, for obtaining metallized and/or coloured etched decorations.

To this end, the invention concerns a method according to claim 1.

The invention also concerns a watch including an external element and/or dial made by this method.

The operating mode makes it possible to obtain high definition raised decorations on non-conductive substrates, such as ceramic, sapphire, glass or similar.

Moreover, the invention obviates the use of organic protective layers which could exhibit degassing during subsequent vacuum treatment for metallization.

Finally, the solution offered does not require the acquisition of expensive photolithography equipment (spin coater, mask aligner, yellow room), and can be performed with equipment usually used for mechanical etching, or more particularly, laser etching.

BRIEF DESCRIPTION OF THE DRAWINGS

Other features and advantages of the invention will appear upon reading the following detailed description, with reference to the annexed drawings, in which.

DETAILED DESCRIPTION OF PREFERRED EMBODIMENTS

The invention concerns a method for fabricating an external element or a timepiece dial, or a jewelry component, made of non-conductive material, especially ceramic or similar, for obtaining metallized and/or coloured etched decorations.

More particularly, the invention concerns a method for fabricating an external element or a timepiece dial made of non-conductive material.

According to the invention, a basic cycle is performed, at least once, including, in this order, the following steps:
- 10: making a base from a substrate made of non-conductive material, or ceramic or glass or sapphire or at least partially amorphous material,
- 20: dry coating said base 1 with at least a first sacrificial protective metal layer 2;
- 30: etching a decoration 3, to a depth at least equal to the local thickness of first sacrificial protective metal layer 2;
- 40: dry coating decoration 3 and the remaining part of first sacrificial protective metal layer 2 with at least a second metal and/or coloured decorative treatment layer 4;
- 50: removing, notably by chemical means, each first sacrificial protective metal layer 2.

Figure 1:
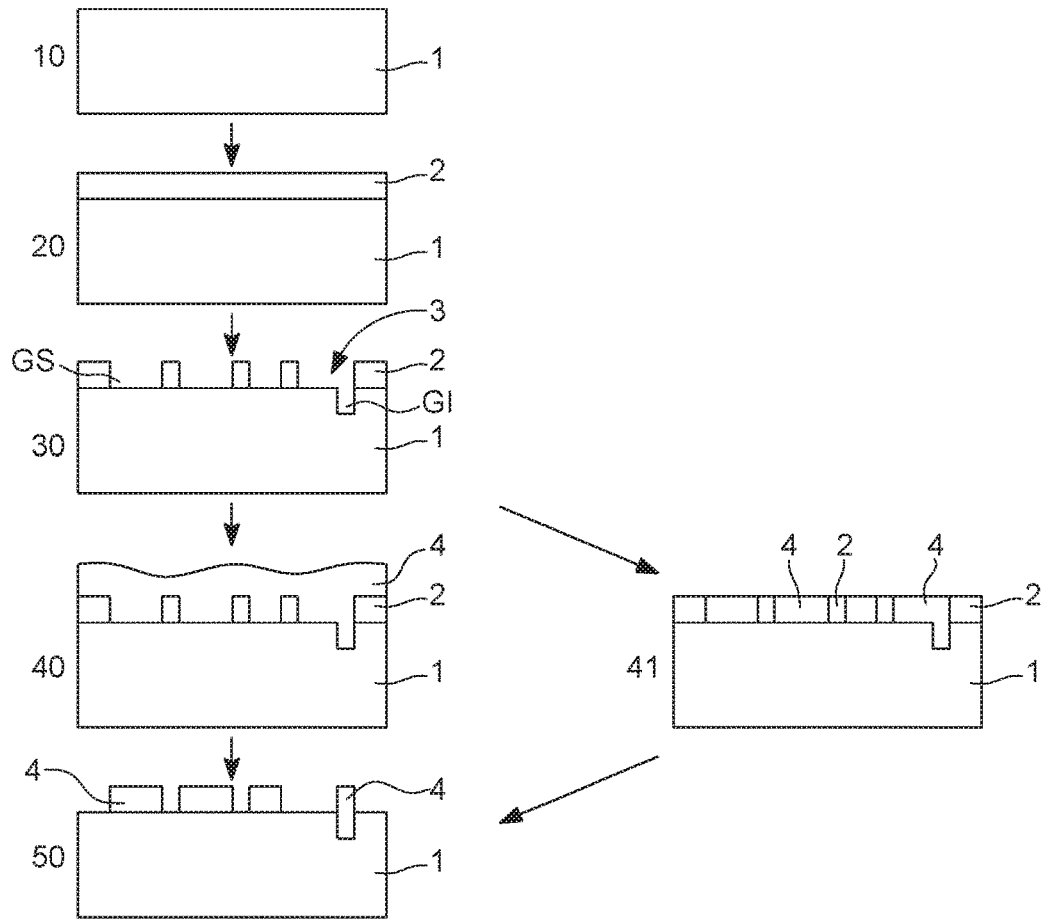
FIG. 1 represents a schematic, sectional view of an operating sequence of a basic cycle of the method of the invention, including making a base, coating the latter with a first sacrificial protective metal layer, etching a decoration, depositing a second layer of metal and/or coloured decorative treatment, and removing the first sacrificial protective metal layer.

FIG. 1 shows a variant 41, which is less easy to realize, wherein operation 40 is modified by depositing the second decorative treatment layer flush with the first sacrificial protective metal layer 2.

For a particular application for making non-conductive, metallized and/or coloured etched dials, an advantageous operating sequence of the invention includes particular parameters:
- 20: placing a sacrificial protective metal layer: preferably but not limited to aluminium, or chromium, using dry means, more particularly by PVD deposition;
- 30: ultrashort pulse laser etching (of the picolaser or femto laser type) of the decoration, with selective ablation of sacrificial protective metal layer 2, and possibly etching of substrate 1, called lower etching GI, as seen in the Figures;
- 40: decorative metal (gold, rhodium, chromium, silicon or otherwise) or coloured (metal oxides, nitrides and carbides and any superposed Layer combination thereof) treatment, using a dry process, more particularly PVD;
- 50: removal of the protective layer by chemical means (NaOH type alkaline solution for aluminium, but also possibly acid for chromium, or otherwise).

The choice of materials is directly defined by the constraints of the operating sequence.

Indeed, the nature of the sacrificial layer and that of the decorative layer must be chosen such that:
- the stripping solution removes the protective layer without degrading the decorative coating;
- the protective layer is not degraded during the etch, notably the laser etch (ultrashort pulse laser of the pico laser or femto laser type), in places other than the defined etch area (possible degradation in proximity to the etch, projection of incandescent particles);
- the protective layer must resist any intermediate cleaning operations.

The choice, in step 20, of a sacrificial metal layer avoids any degassing. Indeed, this sacrificial metal layer is composed of a material that is inert in the conditions of pressure (which may be as low as $P=1 \cdot 10^{-8}$ mbar) and temperature (typically T 300° C.) encountered during the decorative treatment of step 40, unlike the lacquers/varnishes used in the prior art, which have the drawback, in these conditions, of degassing and/or partially decomposing, which could impair the quality and/or aesthetics of the decorative treatment.

Preferably, prior to performing step 20 of coating base 1 with at least a first sacrificial protective metal layer 2, a cleaning operation is performed: using detergent and/or solvent, with/without ultrasounds, with/without mechanical stress, with/without temperature, to ensure that the surface is clean and thus to ensure good adhesion of the sacrificial protective metal layer.

Figure 2:
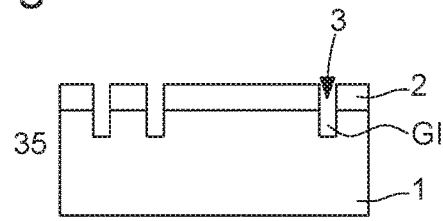
FIG. 2 represents, in a similar manner to FIG. 1, the single etching step wherein all the etches reach the substrate of the base.
Figure 3:
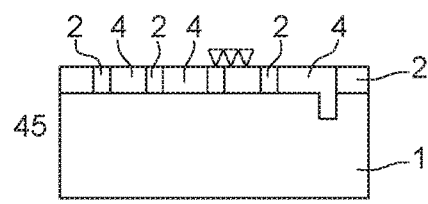
FIG. 3 represents, in a similar manner to FIG. 1, an optional mechanical levelling step of the first sacrificial protective metal layer, and of the second decorative treatment layer, before removal of the first sacrificial protective metal layer.
Figure 4:
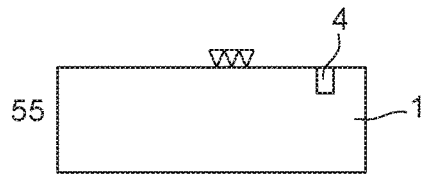
FIG. 4 represents, in a similar manner to FIG. 3, an optional mechanical levelling step of the second decorative treatment layer, after removal of the first sacrificial protective metal layer.

In a particular variant, during operation 30 of etching a decoration 3, the etch is performed over the entire substrate of base 1, as seen in FIG. 2.

Naturally, the blank should be cleaned after the etching operation, before the second decorative treatment deposition is performed, notably by PVD. This is a conventional cleaning operation (using detergent and/or solvent, with/without ultrasounds, with/without mechanical stress, with/without temperature), but it must not degrade the sacrificial metal protection. In particular, in the case where the sacrificial metal protection includes aluminium, cleaning solutions with too basic pH level must not be used.

According to the invention, before or after chemical removal (step 50) of each first sacrificial protective metal layer 2, the compound thus formed is mechanically leveled (in a step 55) on the upper level of base 1.

In a particular variant, after dry coating (step 40) decoration 3 and the remaining part of first sacrificial protective metal layer 2 with at least a second metal and/or coloured decorative treatment layer 4, the compound thus formed on the upper level of first sacrificial protective metal layer 2 is mechanically leveled (step 45).

In another particular variant, prior to chemical removal (step 50) of each first sacrificial protective metal layer 2, the compound thus formed on the upper level of base 1 is mechanically leveled (step 55).

In another particular variant, after chemical removal (step 50) of each first sacrificial protective metal layer 2, the compound thus formed on the upper level of base 1 is mechanically leveled (step 55).

In an advantageous variant, in step 20 of dry coating base 1 with at least a first sacrificial protective metal layer 2, the dry coating is performed by PVD vacuum deposition.

Various methods may be suitable: vacuum evaporation, vacuum spraying, PECVD, or otherwise.

In a particular variant, in step 20 for dry coating base 1 with at least a first sacrificial protective metal layer 2, this coating is made with a first thickness of more than 50 nanometres.

In an advantageous variant, in step 40 of dry coating decoration 3 and the remaining part of first sacrificial protective metal layer 2, with at least a second metal and/or coloured decorative treatment layer 4, the dry coating is performed by PVD vacuum deposition.

Various methods may be suitable: vacuum evaporation, vacuum spraying, CVD, ALD, or otherwise.

More particularly, in step 40 of dry coating decoration 3 and the remaining part of first sacrificial protective metal layer 2 with at least a second metal and/or coloured decorative treatment layer 4, the dry coating is made with a second thickness comprised between 50 nanometres and 2000 nanometres, more particularly between 50 nanometres and 1000 nanometres.

Preferably, in step 20 of dry coating base 1 with at least a first sacrificial protective metal layer 2, the coating is made with a first thickness which is greater than or equal to the difference between, on the one hand, a second thickness of a second metal and/or coloured decorative treatment layer 4 in step 40 of dry coating decoration 3 and the remaining part of said first sacrificial protective metal layer 2, and on the other hand, the etch depth in the substrate of base 1 during operation 30 of etching a decoration 3.

In an advantageous variant, in step 30 of etching a decoration 3, to a depth at least equal to the local thickness of the first sacrificial protective metal layer 2, the etch is performed using a picolaser or femto laser.

As an alternative to the invention, according to a similar operating mode, it is possible to perform this etch using different means, alone or in combination: laser, tool machining, ion bombardment, chemical etching, or suchlike.

In a particular variant, in step 30 of etching a decoration 3, to a depth at least equal to the local thickness of the first sacrificial protective metal layer 2, the etch is made in the form of a juxtaposition of deep conical or pyramidal recesses.

More particularly, this etch 30 is performed to a depth in base 1 comprised between 20 nanometres and the total thickness of base 1.

Thus, it is possible, for example, to hollow a very deep conical recess over the entire thickness of a dial, for example over a thickness on the order of a millimetre.

More particularly, for other applications, notably display applications, a substantially flat laser etch is performed, to a depth of around 20 μm.

In another variant, a deeper laser etch is made, for example to define a recess, or a bevelled date aperture or similar. The invention can produce a very fine, two-coloured, bevelled aperture, which is excessively difficult to make using other means.

Figure 5:
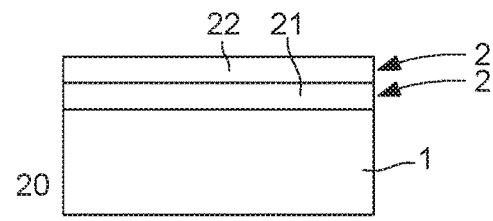
FIG. 5 represents, in a similar manner to FIG. 1, the single step of depositing a first sacrificial protective metal layer, with two superposed sacrificial protective metal layers.

In a particular variant, as seen in FIG. 5, in step 20 of dry coating base 1 with at least a first sacrificial protective metal layer 2, the dry coating is performed with a superposition of several first layers 2 of different types 21, 22.

Figure 6:
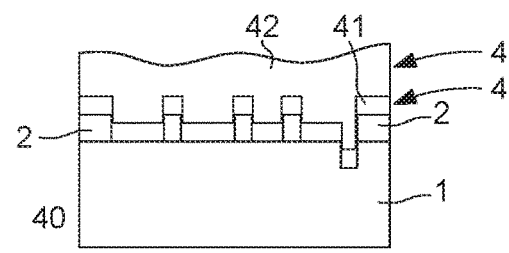
FIG. 6 represents, in a similar manner to FIG. 1, the single step of depositing a second metal and/or coloured decorative treatment layer, with two superposed decorative treatment layers.
Figure 7:
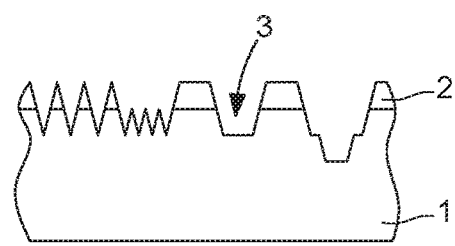
FIG. 7 represents an etch detail including single or superposed conical etches, and single or superposed pyramid etches.
Figure 8:
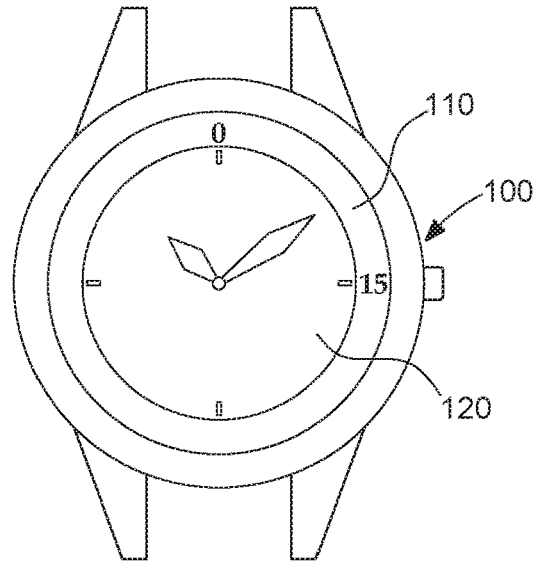
FIG. 8 represents a watch including a bezel and a dial made of ceramic produced and decorated by the method of the invention.

The choice of materials that can be used is quite wide:
for the non-conductive substrate, in particular, the following can be used: ceramic, sapphire, glass, organic glass, plastic, enamel, at least partially amorphous material;
for the sacrificial metal protection, for example, aluminium or chromium:
  for a sacrificial metal protection including aluminium, a decorative treatment can include: Au, Cr, Rh, Ti, Si, and/or alloys and/or oxides and/or nitrides and/or carbides and/or combinations of these metals;
  for a sacrificial metal protection including chromium, a decorative treatment can include: Au, Rh, Ti, Si, and/or alloys and/or oxides and/or nitrides and/or carbides and/or combinations of these metals;

In a particular variant, as seen in FIG. 6, in step 40 of dry coating decoration 3 and the remaining part of said first sacrificial protective metal layer 2, with at least a second metal and/or coloured decorative treatment 4, the dry coating is performed with a superposition of several second layers 4 of different types, 41, 42.

More particularly, this superposition of several second layers 4 is made with a chromium layer of 50 to 250 nanometres and a gold layer of 50 to 150 nanometres. More particularly, the deposition is made with a superposition of a thick chromium layer of around 200 nanometres and a thick gold layer of around 100 nanometres.

The invention is particularly well suited to the preferred case where, in step 10 of making base 1, a ceramic substrate is used.

The invention makes it possible to make two-coloured or multi-coloured components.

Indeed, iteration of the method can be carried out, with different etched decorations and/or different decorative treatments.

Thus, once phase 50 has been performed and a first basic cycle has finished, and after a cleaning operation, at least one more basic cycle can be performed with modified parameters for the etching operation and/or for the choice of decorative treatment.

It is thus possible, without limiting the number of iterations, to restart, with modified parameters, the entire operating sequence of the basic cycle with:
  deposition of the sacrificial metal protection;
  etching of another decoration, for example elsewhere on the substrate and/or partially on an etch already made in a previous phase;
  deposition of another decorative treatment;
  dissolution of the sacrificial metal protection.

This cycle can be repeated several times to obtain multi-coloured components, for example, having parts with a different appearance made of Au, Ti, Si, Rh or otherwise.

A particular etch texture can also provide a particular visual appearance, depending on the roughness, density and etch depth, which produce reflections, or a particular finish of the decorative treatment applied, for example, satin, semi-matt, brilliant or otherwise.

The invention also concerns a watch 100, which includes an external element 110, such as a bezel, case or similar, notably made of ceramic, and/or which includes a dial 120, notably made of ceramic, made by the method according to the invention.

This operating mode obviates the use of expensive photolithography equipment to obtain very high definition decorations.

Moreover, the use of a sacrificial protective metal layer avoids any problematic degassing during the preferred vacuum treatment for application of the metal and/or coloured decorative treatment layer.

The invention lends itself well to decoration of non-conductive dials (ceramic, enamel, sapphire, plastic or otherwise), crystals (glass, sapphire, or otherwise), components made of plastic material, watch cases, case middles, bezels, crowns and otherwise. The quality, finesse and contrast of the decorations, which can be made of precious metals, make possible very refined ornamentation, compatible with luxury watches, and especially ornamentation of complication components, such as, for example, high resolution moon phase indicators. The reasonable cost of implementing the method also allows the use thereof in more widely used timepiece components.

Naturally, the invention is advantageous, not only for parts of timepiece components, but also for jewelry or jewelry components, or spectacles or fashion items.

Indeed, the invention makes it possible to change and substantially enhance the appearance of components directly visible to the user, with innovative decorations, and assists in promoting the brand and the product. More particularly, the invention can be used for identification marking and/or anti-counterfeiting marking.

The invention claimed is:

1. A method for fabricating an external element or a timepiece dial made of non-conductive material, the method including a basic cycle performed at least once, comprising, in this order, the following steps:
   making a base from a substrate made of non-conductive material, or ceramic or glass or sapphire or at least partially amorphous material;
   dry coating said base with at least one first sacrificial protective metal layer;
   etching a decoration, to a depth at least equal to the local thickness of said at least one first sacrificial protective metal layer, by an ultrashort pulse laser of a femto laser or pico laser type;
   coating said decoration and a remaining part of said at least one first sacrificial protective metal layer with at least a second metal and/or coloured decorative treatment layer; and
   chemically removing said at least one first sacrificial protective metal layer such that at least a portion of said second metal and/or coloured decorative treatment layer remains on the base,
   wherein the method includes:
      after the coating and before the chemically removing said at least one first sacrificial protective metal layer, mechanically levelling said at least one first sacrificial protective metal layer and said second metal and/or coloured decorative treatment layer on an upper level of said base; or
      after the chemically removing said at least one first sacrificial protective metal layer, mechanically levelling said second metal and/or coloured decorative treatment layer on the upper level of said base.

2. The method according to claim 1, wherein, during said etching a decoration, said etch is performed over an entirety of said substrate of said base.

3. The method according to claim 1, wherein, during the dry coating said base with said at least one first sacrificial protective metal layer, said dry coating is performed by vacuum PVD deposition.

4. The method according to claim 1, wherein, during the dry coating said base with said at least one first sacrificial protective metal layer, said coating is made with a first thickness greater than 50 nanometres.

5. The method according to claim 1, wherein, during the coating said decoration and said remaining part of said at least one first sacrificial protective metal layer with at least a second metal and/or coloured decorative treatment layer, said coating is performed by vacuum PVD deposition.

6. The method according to claim 1, wherein, during the coating said decoration and said remaining part of said at least one first sacrificial protective metal layer with at least a second metal and/or coloured decorative treatment layer, said coating is made with a second thickness comprised between 50 nanometres and 1,000 nanometres.

7. The method according to claim 1, wherein, during the dry coating said base with said at least one first sacrificial protective metal layer, said coating is made with a first thickness which is greater than or equal to the difference between a second thickness of a second metal and/or coloured decorative treatment layer during the dry coating said decoration and the remaining part of said at least one first sacrificial protective metal layer, and the depth in the substrate of said base during said etching a decoration.

8. The method according to claim 1, wherein, during the etching a decoration to a depth at least equal to the local thickness of said at least one first sacrificial protective metal layer, said etching is made in the form of a juxtaposition of deep conical or pyramidal recesses.

9. The method according to claim 1, wherein the depth of said etching is made to a depth in said base is comprised between 20 nanometres and a total thickness of said base.

10. The method according to claim 1, wherein, during the dry coating said base with said at least one first sacrificial protective metal layer, said dry coating is performed with a superposition of several said first layers of different types.

11. The method according to claim 1, wherein, during the coating said decoration and said remaining part of said at least one first sacrificial protective metal layer with at least a second metal and/or coloured decorative treatment, said coating is performed with a superposition of several said second layers of different types.

12. The method according to claim 11, wherein said superposition of several said second layers is made with a chromium layer of 50 to 250 nanometres and a gold layer of 50 to 150 nanometres.

13. The method according to claim 1, wherein, during the making said base, a ceramic substrate is used.

14. The method according to claim 1, wherein, following completion of a first said basic cycle and a cleaning operation, at least one more said basic cycle is performed with modified parameters for said etching and/or for a choice of said decorative treatment.

15. The method according to claim 1, wherein said at least one first sacrificial protective metal layer is composed of a material that is inert at a pressure of $1.10^{-8}$ mbar and a temperature of less than or equal to 300° C. during the coating the decoration.

16. The method according to claim 1, wherein, during the dry coating said base with said at least one first sacrificial protective metal layer, said coating is made with a first thickness greater than 50 nanometres, and
   wherein, during the coating said decoration and said remaining part of said at least one first sacrificial protective metal layer with at least a second metal and/or coloured decorative treatment layer, said coating is made with a second thickness comprised between 50 nanometres and 1,000 nanometres.

* * * * *